US 8,552,961 B2

(12) United States Patent
Yang et al.

(10) Patent No.: US 8,552,961 B2
(45) Date of Patent: Oct. 8, 2013

(54) SHIFT REGISTER CIRCUIT

(75) Inventors: Yu-Chung Yang, Hsin-Chu (TW);
Yung-Chih Chen, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 176 days.

(21) Appl. No.: 13/106,873

(22) Filed: May 13, 2011

(65) Prior Publication Data
US 2012/0169703 A1 Jul. 5, 2012

(30) Foreign Application Priority Data
Dec. 30, 2010 (TW) .............................. 99147046 A

(51) Int. Cl.
G09G 3/36 (2006.01)
(52) U.S. Cl.
USPC ................. 345/100; 345/98; 345/99; 377/64; 377/65; 377/66; 377/67; 377/68; 377/69; 377/70; 377/71; 377/72; 377/73; 377/74; 377/75; 377/76; 377/77; 377/78; 377/79; 377/80; 377/81
(58) Field of Classification Search
USPC ................................. 377/64–81; 345/98–100
See application file for complete search history.

(56) References Cited

U.S. PATENT DOCUMENTS

| 8,229,058 B2 | 7/2012 | Tsai | |
| 2005/0201508 A1* | 9/2005 | Shin et al. | 377/10 |
| 2006/0290390 A1* | 12/2006 | Jang et al. | 327/112 |
| 2007/0018940 A1* | 1/2007 | Park | 345/100 |
| 2009/0135991 A1 | 5/2009 | Chen | |
| 2010/0150303 A1 | 6/2010 | Tsai | |
| 2010/0182227 A1* | 7/2010 | Tsou | 345/100 |
| 2010/0260312 A1 | 10/2010 | Tsai | |
| 2010/0316182 A1 | 12/2010 | Lai | |
| 2011/0134107 A1 | 6/2011 | Lebrun | |

FOREIGN PATENT DOCUMENTS

| CN | 101552040 A | 10/2009 |
| TW | 201021416 | 6/2010 |
| TW | 201023156 | 6/2010 |
| TW | 201037675 | 10/2010 |

* cited by examiner

Primary Examiner — Quan-Zhen Wang
Assistant Examiner — Chad Dicke
(74) Attorney, Agent, or Firm — Winston Hsu; Scott Margo

(57) ABSTRACT

A shift register circuit includes plural shift register stages for providing plural gate signals. Each shift register stage includes a driving unit, an input unit, a driving adjustment unit and a pull-down unit. The driving unit is utilized for outputting a gate signal according to a system clock and a driving control voltage. The input unit is put in use for outputting the driving control voltage according to an input control signal and a first input signal. The driving adjustment unit is employed for adjusting the driving control voltage according to a second input signal and a third input signal. The pull-down unit is used for pulling down the gate signal and the driving control voltage according to a fourth input signal.

17 Claims, 7 Drawing Sheets

SHIFT REGISTER CIRCUIT

BACKGROUND OF THE INVENTION

1. Field of the Invention

The present invention relates to a shift register circuit, and more particularly, to a shift register circuit capable of reducing a period required for pulling down a gate signal.

2. Description of the Prior Art

Liquid crystal displays (LCDs) have advantages of a thin profile, low power consumption, and low radiation, and are broadly adopted for application in media players, mobile phones, personal digital assistants (PDAs), computer displays, and flat screen televisions. The operation of a liquid crystal display is featured by modulating the voltage drop across opposite sides of a liquid crystal layer for twisting the angles of liquid crystal molecules in the liquid crystal layer so that the transmittance of the liquid crystal layer can be controlled for illustrating images with the aid of light source provided by a backlight module. In general, the liquid crystal display comprises plural pixel units, a source driver, and a shift register circuit. The source driver is utilized for providing plural data signals to be written into the pixel units. The shift register circuit comprises a plurality of shift register stages and functions to generate plural gate signals for controlling the operations of writing the data signals into the pixel units. That is, the shift register circuit is a crucial device for providing a control of writing the data signals into the pixel units.

However, in the operation of a prior-art shift register circuit, each gate signal provided by one corresponding shift register stage cannot be quickly pulled down from high level voltage to low level voltage following the level switching of system clock, thereby reducing the effective charging time of pixel unit. That is, the charging rate of pixel unit is hard to boost. In some prior-art shift register circuits, the size of driving transistor in each shift register stage is enlarged for enhancing pixel charging rate, which results in significantly higher power consumption. Besides, if the shift register circuit is integrated in a display panel comprising pixel array to bring the cost down, i.e. based on a gate-driver on array (GOA) architecture, the aforementioned shift register stages are sequentially arranged in a lengthy border area of the display panel so that each shift register stage can be directly connected to one corresponding gate line, and dimensions of the lengthy border area are required to increase for housing driving transistors with increased size.

SUMMARY OF THE INVENTION

In accordance with an embodiment of the present invention, a shift register circuit is disclosed for providing plural gate signals to plural gate lines. The shift register circuit comprises a plurality of shift register stages. And an Nth shift register stage of the shift register stages comprises a driving unit, an input unit, a driving adjustment unit and a pull-down unit. The driving unit, electrically connected to an Nth gate line of the gate lines, is utilized for outputting an Nth gate signal of the gate signals according to a first system clock and a driving control voltage. The Nth gate line is employed to transmit the Nth gate signal. The input unit, electrically connected to the driving unit, is employed to output the driving control voltage according to an input control signal and a first input signal. The driving adjustment unit, electrically connected to the driving unit and the input unit, is put in use for adjusting the driving control voltage according to a second input signal and a third input signal. The pull-down unit, electrically connected to the input unit and the Nth gate line, is utilized for pulling down the Nth gate signal and the driving control voltage according to a fourth input signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
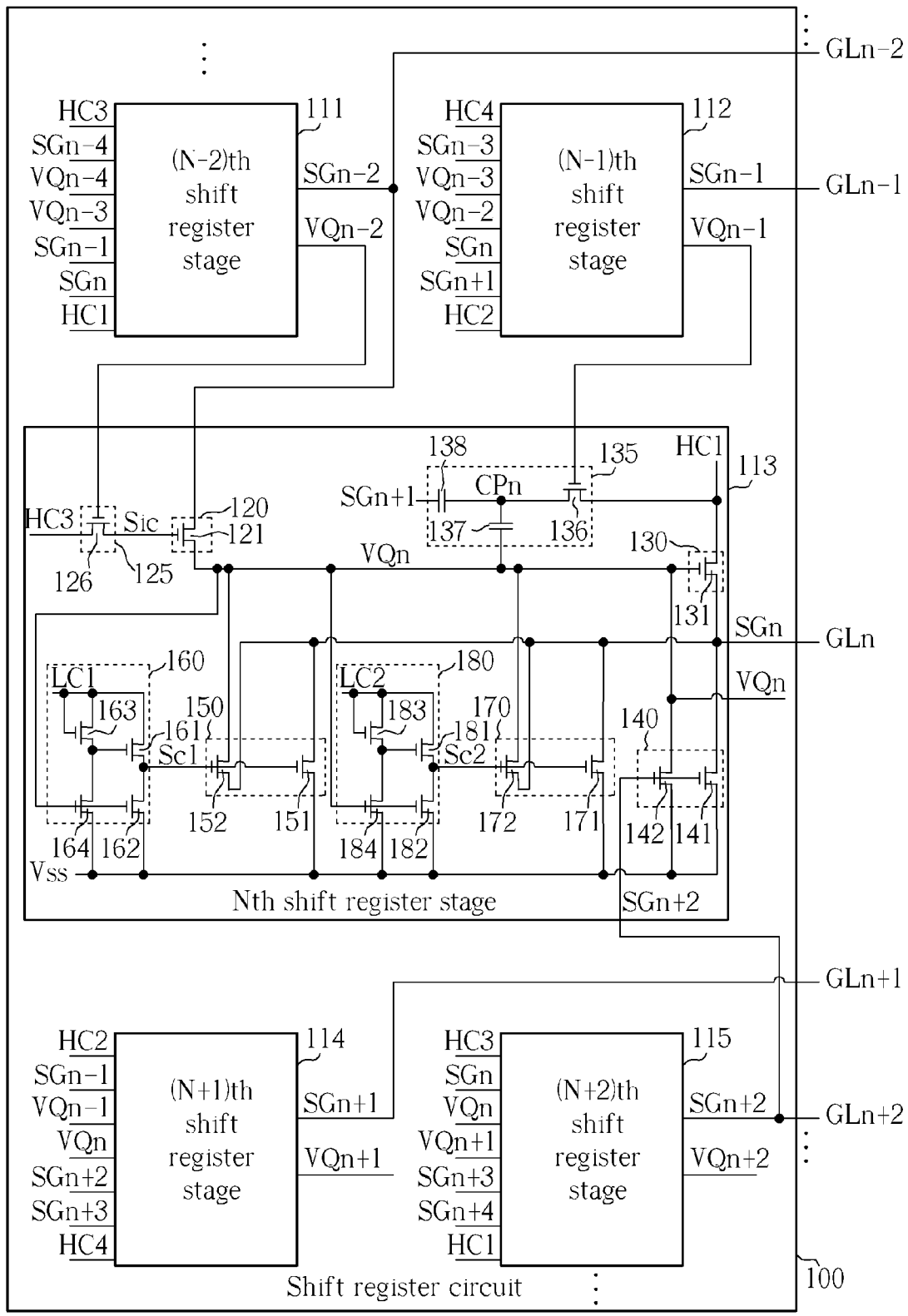
FIG. 1 is a schematic diagram showing a shift register circuit in accordance with a first embodiment of the present invention.

FIG. 1 is a schematic diagram showing a shift register circuit in accordance with a first embodiment of the present invention. As shown in FIG. 1, the shift register circuit 100 comprises a plurality of shift register stages and, for ease of explanation, illustrates an (N−2)th shift register stage 111, an (N−1)th shift register stage 112, an Nth shift register stage 113, an (N+1)th shift register stage 114 and an (N+2)th shift register stage 115. For the sake of brevity, only the internal structure of the Nth shift register stage 113 is exemplified in detail. The internal structures of other shift register stages are similar to the Nth shift register stage 113 and can be inferred by analogy. In the operation of the shift register circuit 100, the Nth shift register stage 113 is utilized for generating a gate signal SGn and a driving control voltage VQn according to a gate signal SGn−2 generated by the (N−2)th shift register stage 111, a driving control voltage VQn−2 generated by the (N−2)th shift register stage 111, a driving control voltage VQn−1 generated by the (N−1)th shift register stage 112, a gate signal SGn+1 generated by the (N+1)th shift register stage 114, a gate signal SGn+2 generated by the (N+2)th shift register stage 115, a first system clock HC1, a third system clock HC3, a first pull-down clock LC1, and a second pull-down clock LC2 having a phase opposite to the first pull-down clock LC1. The circuit functions of other shift register stages are similar to the Nth shift register stage 113 and can be inferred by analogy. Regarding the system clocks HC1-HC4 shown in FIG. 1, it is noted that the third system clock HC3 has a 180-degree phase difference relative to the first system clock HC1, the second system clock HC2 has a 90-degree phase difference relative to the first system clock HC1, and the fourth system clock HC4 has a 180-degree phase difference relative to the second system clock HC2.

The Nth shift register stage 113 comprises an input unit 120, an input control unit 125, a driving unit 130, a driving adjustment unit 135, a first pull-down unit 140, a second pull-down unit 150, a first control unit 160, a third pull-down unit 170, and a second control unit 180. The input control unit 125, electrically connected to the (N−2)th shift register stage 111, is utilized for providing an input control signal Sic according to the driving control voltage VQn−2 and the third system clock HC3. The input unit 120, electrically connected to the (N−2)th shift register stage 111 and the input control unit 125, is utilized for outputting the driving control voltage VQn according to the gate signal SGn−2 and the input control signal Sic.

The driving unit 130, electrically connected to the input unit 120 and a gate line GLn, is utilized for outputting the gate signal SGn according to the driving control voltage VQn and the first system clock HC1. The gate line GLn is employed to transmit the gate signal SGn. The driving adjustment unit 135, electrically connected to the driving unit 130, the input unit 120, the (N−1)th shift register stage 112 and the (N+1)th shift register stage 114, is put in use for adjusting the driving control voltage VQn according to the driving control voltage VQn−1, the gate signal SGn+1 and the first system clock HC1. The first pull-down unit 140, electrically connected to the input unit 120, the (N+2)th shift register stage 115 and the gate line GLn, is utilized for pulling down the driving control voltage VQn and the gate signal SGn according to the gate signal SGn+2.

The first control unit 160, electrically connected to the input unit 120, is utilized for generating a first control signal Sc1 according to the driving control voltage VQn and the first pull-down clock LC1. The second pull-down unit 150, electrically connected to the first control unit 160, the input unit 120 and the gate line GLn, is utilized for pulling down the gate signal SGn and the driving control voltage VQn according to the first control signal Sc1. The second control unit 180, electrically connected to the input unit 120, is utilized for generating a second control signal Sc2 according to the driving control voltage VQn and the second pull-down clock LC2. The third pull-down unit 170, electrically connected to the second control unit 180, the input unit 120 and the gate line GLn, is utilized for pulling down the gate signal SGn and the driving control voltage VQn according to the second control signal Sc2.

In the embodiment shown in FIG. 1, the driving adjustment unit 135 comprises a first transistor 136, a first capacitor 137 and a second capacitor 138, the second pull-down unit 150 comprises a second transistor 151 and a third transistor 152, the first control unit 160 comprises a fourth transistor 161, a fifth transistor 162, a sixth transistor 163 and a seventh transistor 164, the third pull-down unit 170 comprises a ninth transistor 171 and a tenth transistor 172, the second control unit 180 comprises an eleventh transistor 181, a twelfth transistor 182, a thirteenth transistor 183 and a fourteenth transistor 184, the driving unit 130 comprises a sixteenth transistor 131, the input unit 120 comprises a seventeenth transistor 121, the input control unit 125 comprises an eighteenth transistor 126, and the first pull-down unit 140 comprises a nineteenth transistor 141 and a twentieth transistor 142. It is noted that each of the transistors aforementioned or to be mentioned may be a thin film transistor (TFT), a field effect transistor (FET) or other similar device having connection/disconnection switching functionality.

The first transistor 136 comprises a first end for receiving the first system clock HC1, a gate end electrically connected to the (N−1)th shift register stage 112 for receiving the driving control voltage VQn−1, and a second end for outputting an adjustment control voltage CPn. The first capacitor 137 comprises a first end electrically connected to the second end of the first transistor 136, and a second end electrically connected to the input unit 120 and the driving unit 130. The second capacitor 138 comprises a first end electrically connected to the second end of the first transistor 136, and a second end electrically connected to the (N+1)th shift register stage 114 for receiving the gate signal SGn+1. Regarding the shift register circuit 100 having the driving adjustment unit 135, it is noted that the gate end of the first transistor 136 is not limited to receive the driving control voltage VQn−1, and the second end of the second capacitor 138 is not limited to receive the gate signal SGn+1. As long as the driving adjustment unit 135 is capable of adjusting the driving control voltage VQn from a high-level voltage to a voltage higher than the high-level voltage, the gate end of the first transistor 136 may be employed to receive a signal other than the driving control voltage VQn−1, and/or the second end of the second capacitor 138 may be employed to receive a signal other than the gate signal SGn+1. For instance, in another embodiment, the second end of the second capacitor 138 may be electrically connected to the gate line GLn for receiving the gate signal SGn.

The seventeenth transistor 121 comprises a first end electrically connected to the (N−2)th shift register stage 111 for receiving the gate signal SGn−2, a gate end for receiving the input control signal Sic, and a second end for outputting the driving control voltage VQn. The eighteenth transistor 126 comprises a first end for receiving the third system clock HC3, a gate end electrically connected to the (N−2)th shift register stage 111 for receiving the driving control voltage VQn−2, and a second end electrically connected to the gate end of the seventeenth transistor 121. The sixteenth transistor 131 comprises a first end for receiving the first system clock HC1, a gate end electrically connected to the second end of the seventeenth transistor 121, and a second end electrically connected to the gate line GLn. The nineteenth transistor 141 comprises a first end electrically connected to the gate line GLn, a gate end electrically connected to the (N+2)th shift register stage 115 for receiving the gate signal SGn+2, and a second end for receiving a power voltage Vss. The twentieth transistor 142 comprises a first end electrically connected to the second end of the seventeenth transistor 121, a gate end electrically connected to the (N+2)th shift register stage 115 for receiving the gate signal SGn+2, and a second end for receiving the power voltage Vss.

The second transistor 151 comprises a first end electrically connected to the gate line GLn, a gate end for receiving the first control signal Sc1, and a second end for receiving the power voltage Vss. The third transistor 152 comprises a first end electrically connected to the second end of the seventeenth transistor 121, a gate end for receiving the first control signal Sc1, and a second end electrically connected to the gate line GLn. The fourth transistor 161 comprises a first end for receiving the first pull-down clock LC1, a gate end electrically connected to the sixth transistor 163, and a second end for outputting the first control signal Sc1. The fifth transistor 162 comprises a first end electrically connected to the second end of the fourth transistor 161, a gate end electrically connected to the second end of the seventeenth transistor 121, and a second end for receiving the power voltage Vss. The sixth transistor 163 comprises a first end for receiving the first pull-down clock LC1, a gate end for receiving the first pull-down clock LC1, and a second end electrically connected to the gate end of the fourth transistor 161. The seventh transistor 164 comprises a first end electrically connected to the gate end of the fourth transistor 161, a gate end electrically connected to the second end of the seventeenth transistor 121, and a second end for receiving the power voltage Vss.

The ninth transistor 171 comprises a first end electrically connected to the gate line GLn, a gate end for receiving the second control signal Sc2, and a second end for receiving the power voltage Vss. The tenth transistor 172 comprises a first end electrically connected to the second end of the seventeenth transistor 121, a gate end for receiving the second control signal Sc2, and a second end electrically connected to the gate line GLn.

The eleventh transistor 181 comprises a first end for receiving the second pull-down clock LC2, a gate end electrically connected to the thirteenth transistor 183, and a second end for outputting the second control signal Sc2. The twelfth transistor 182 comprises a first end electrically connected to the second end of the eleventh transistor 181, a gate end electrically connected to the second end of the seventeenth transistor 121, and a second end for receiving the power voltage Vss. The thirteenth transistor 183 comprises a first end for receiving the second pull-down clock LC2, a gate end for receiving the second pull-down clock LC2, and a second end electrically connected to the gate end of the eleventh transistor 181. The fourteenth transistor 184 comprises a first end electrically connected to the gate end of the eleventh transistor 181, a gate end electrically connected to the second end of the seventeenth transistor 121, and a second end for receiving the power voltage Vss.

Figure 2:
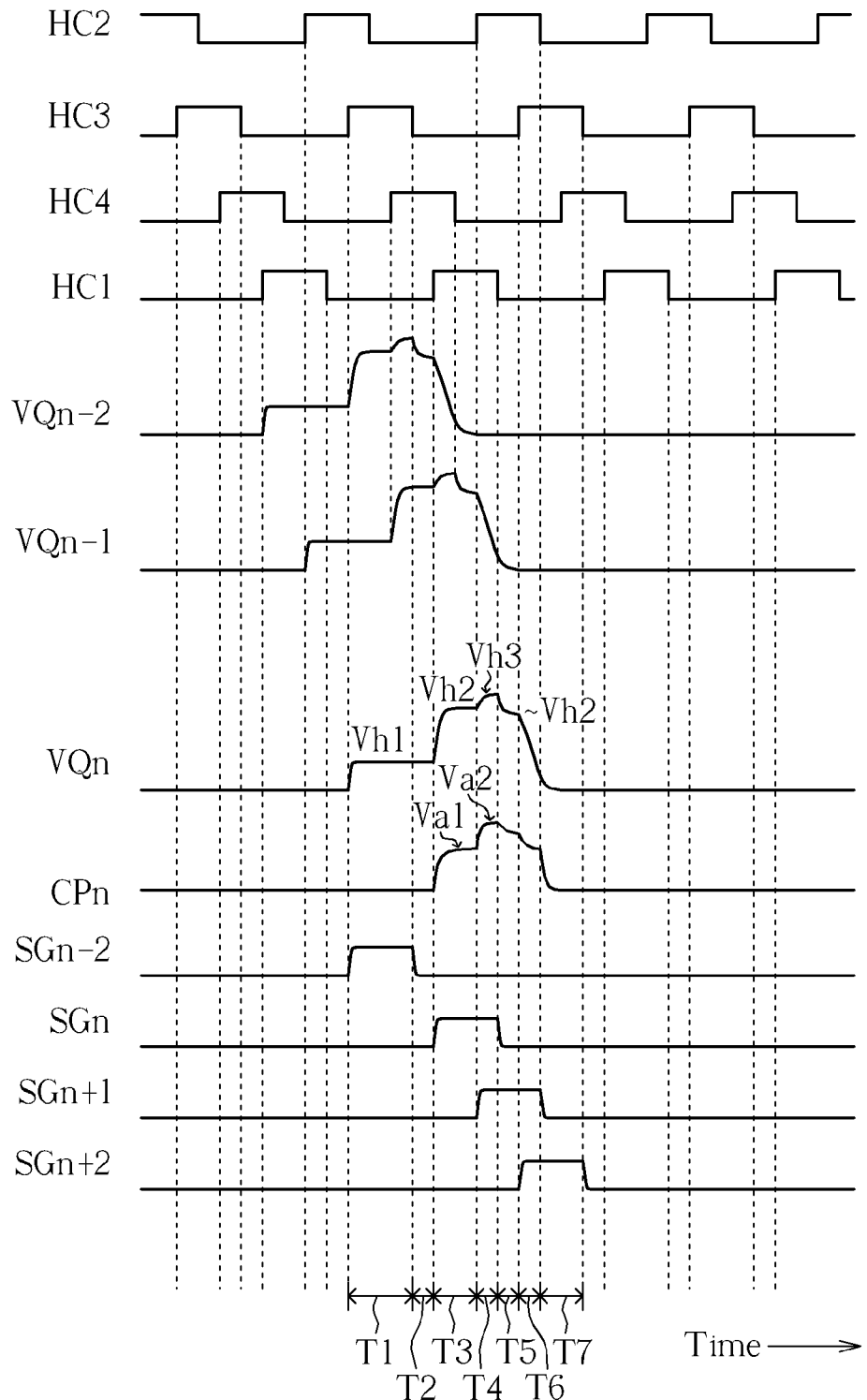
FIG. 2 is a schematic diagram showing related signal waveforms regarding the operation of the shift register circuit illustrated in FIG. 1, having time along the abscissa.

FIG. 2 is a schematic diagram showing related signal waveforms regarding the operation of the shift register circuit 100 illustrated in FIG. 1, having time along the abscissa. The signal waveforms in FIG. 2, from top to bottom, are the second system clock HC2, the third system clock HC3, the fourth system clock HC4, the first system clock HC1, the driving control voltage VQn−2, the driving control voltage VQn−1, the driving control voltage VQn, the adjustment control voltage CPn, the gate signal SGn−2, the gate signal SGn, the gate signal SGn+1, and the gate signal SGn+2. Referring to FIG. 2 in conjunction with FIG. 1, during an interval T1, the input control unit 125 outputs the input control signal Sic having high level voltage according to the driving control voltage VQn−2 having high level voltage and the third system clock HC3 having high level voltage. In turn, the input unit 120 pulls up the driving control voltage VQn to a first voltage Vh1 according to the input control signal Sic having high level voltage and the gate signal SGn−2 having high level voltage. During an interval T2, the third system clock HC3 switches from high level voltage to low level voltage, and the input control signal Sic is then lowered to low level voltage for turning off the seventeenth transistor 121, causing the driving control voltage VQn to float.

During an interval T3, the driving control voltage VQn is pulled up to a second voltage Vh2 by the rising edge of the first system clock HC1 through coupling of the device capacitor of the sixteenth transistor 131, thereby turning on the sixteenth transistor 131 for pulling up the gate signal SGn to high level voltage. At this time, the first transistor 136 pulls up the adjustment control voltage CPn to a voltage Va1 according to the driving control voltage VQn−1 having high level voltage and the first system clock HC1 having high level voltage. Meanwhile, the driving control voltage VQn is also pulled up by the rising edge of the adjustment control voltage CPn during the interval T3 through coupling of the first capacitor 137, thereby boosting the second voltage Vh2 higher. During an interval T4, the first transistor 136 is turned off by the driving control voltage VQn−1 lowered to low level voltage, causing the adjustment control voltage CPn to float. And the adjustment control voltage CPn is then pulled up from the voltage Va1 to a voltage Va2 by the rising edge of the gate signal SGn+1 through coupling of the second capacitor 138. At this time, the driving control voltage VQn is further pulled up from the second voltage Vh2 to a third voltage Vh3 by the rising edge of the adjustment control voltage CPn during the interval T4 through coupling of the first capacitor 137.

During an interval T5, the driving control voltage VQn is pulled down to approximate the second voltage Vh2 by the falling edge of the first system clock HC1 through coupling of the device capacitor of the sixteenth transistor 131. At this time, the sixteenth transistor 131 is still turned on by the driving control voltage VQn, and therefore the gate signal SGn can be quickly pulled down to low level voltage according to the first system clock HC1 having low level voltage during the interval T5. During an interval T6, the twentieth transistor 142 is turned on by the gate signal SGn+2 having high level voltage, and the driving control voltage VQn is pulled down for turning off the sixteenth transistor 131. Concurrently, the nineteenth transistor 141 is also turned on by the gate signal SGn+2 having high level voltage, for pulling down the gate signal SGn. During an interval T7, the adjustment control voltage CPn is pulled down by the falling edge of the gate signal SGn+1 through coupling of the second capacitor 138.

In summary, by keeping the sixteenth transistor 131 in a turn-on state during a short period after the first system clock HC1 is switched from high level voltage to low level voltage, the driving unit 130 is able to quickly pull down the gate signal SGn to low level voltage, which may be employed to significantly reduce the pull-down time of the gate signal SGn for boosting pixel charging rate by increasing effective pixel charging time. Alternatively, the size of the sixteenth transistor 131 may be reduced for lowering power consumption of the shift register circuit 100, and for downsizing the border area required to accommodate the shift register circuit 100 so as to bring the cost down.

Figure 3:
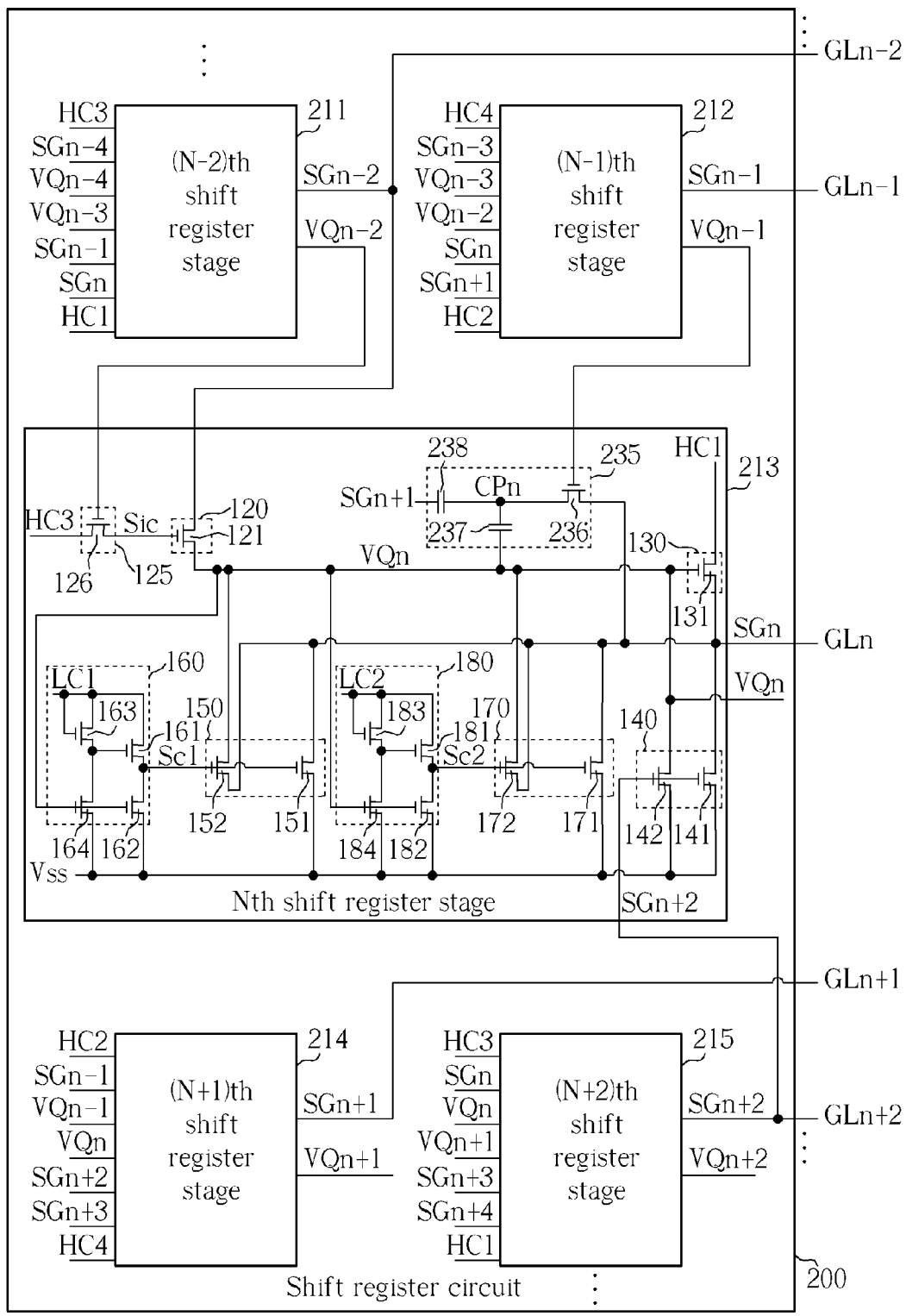
FIG. 3 is a schematic diagram showing a shift register circuit in accordance with a second embodiment of the present invention.

FIG. 3 is a schematic diagram showing a shift register circuit in accordance with a second embodiment of the present invention. As shown in FIG. 3, the shift register circuit 200 comprises a plurality of shift register stages and, for ease of explanation, illustrates an (N−2)th shift register stage 211, an (N−1)th shift register stage 212, an Nth shift register stage 213, an (N+1)th shift register stage 214 and an (N+2)th shift register stage 215. For the sake of brevity, only the internal structure of the Nth shift register stage 213 is exemplified in detail. The internal structures of other shift register stages are similar to the Nth shift register stage 213 and can be inferred by analogy. The Nth shift register stage 213 is similar to the Nth shift register stage 113 shown in FIG. 1, differing in that the driving adjustment unit 135 is replaced with a driving adjustment unit 235. The driving adjustment unit 235, electrically connected to the driving unit 130, the input unit 120, the (N−1)th shift register stage 212, the (N+1)th shift register stage 214 and the gate line GLn, is put in use for adjusting the driving control voltage VQn according to the driving control voltage VQn−1, the gate signal SGn+1 and the gate signal SGn.

In the embodiment shown in FIG. 3, the driving adjustment unit 235 comprises a first transistor 236, a first capacitor 237 and a second capacitor 238. The first transistor 236 comprises a first end electrically connected to the gate line GLn for receiving the gate signal SGn, a gate end electrically connected to the (N−1)th shift register stage 212 for receiving the driving control voltage VQn−1, and a second end for outputting an adjustment control voltage CPn. The first capacitor 237 comprises a first end electrically connected to the second end of the first transistor 236, and a second end electrically connected to the input unit 120 and the driving unit 130. The second capacitor 238 comprises a first end electrically connected to the second end of the first transistor 236, and a second end electrically connected to the (N+1)th shift register stage 214 for receiving the gate signal SGn+1. Likewise, regarding the shift register circuit 200 having the driving adjustment unit 235, it is noted that the gate end of the first transistor 236 is not limited to receive the driving control voltage VQn−1, and the second end of the second capacitor 238 is not limited to receive the gate signal SGn+1. As long as the driving adjustment unit 235 is capable of adjusting the driving control voltage VQn from a high-level voltage to a voltage higher than the high-level voltage, the gate end of the first transistor 236 may be employed to receive a signal other than the driving control voltage VQn−1, and/or the second end of the second capacitor 238 maybe employed to receive a signal other than the gate signal SGn+1. The gate-signal scanning operation of the shift register circuit 200 is similar to the aforementioned gate-signal scanning operation of the shift register circuit 100 and can be inferred by analogy.

Figure 4:
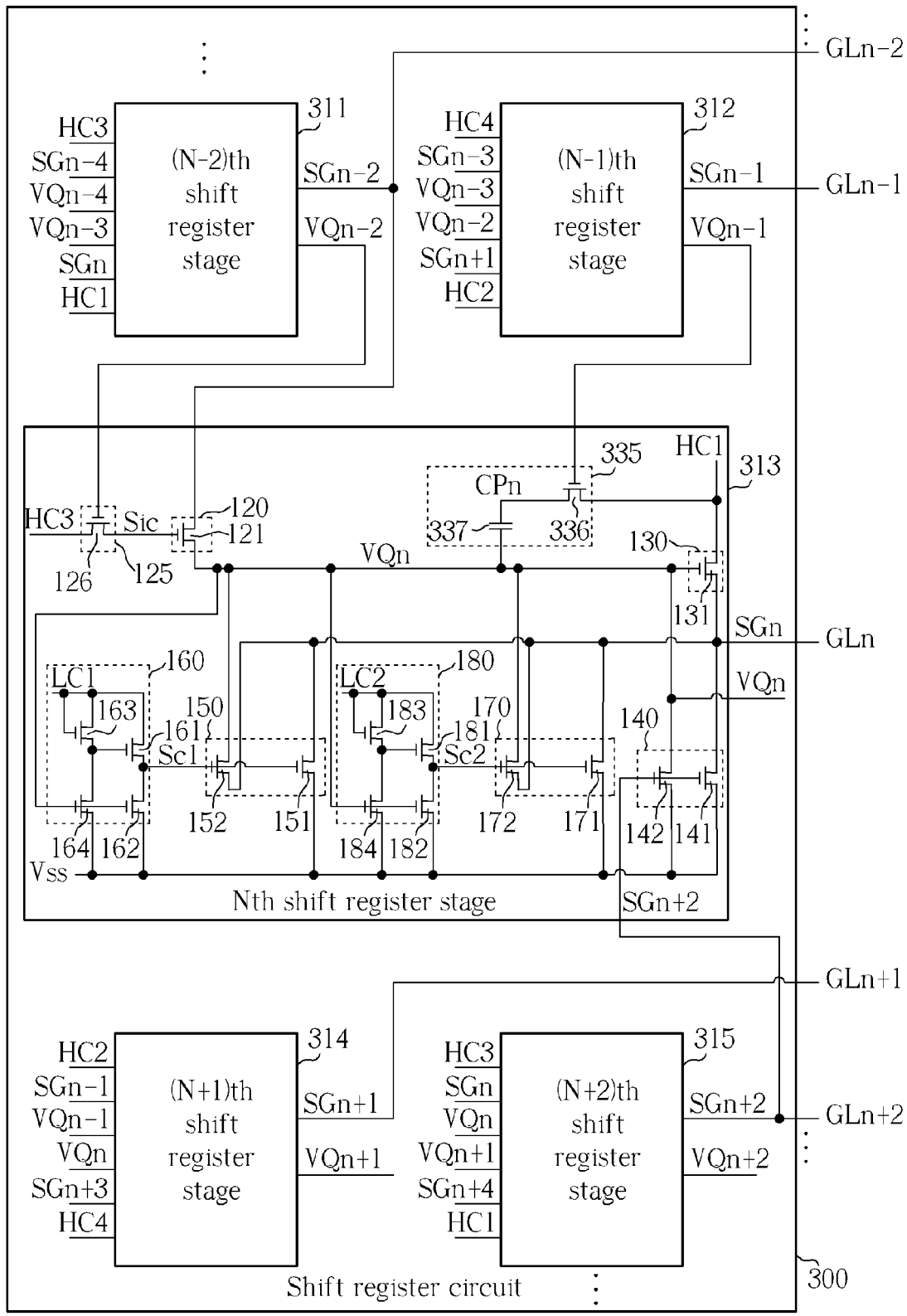
FIG. 4 is a schematic diagram showing a shift register circuit in accordance with a third embodiment of the present invention.

FIG. 4 is a schematic diagram showing a shift register circuit in accordance with a third embodiment of the present invention. As shown in FIG. 4, the shift register circuit 300 comprises a plurality of shift register stages and, for ease of explanation, illustrates an (N−2)th shift register stage 311, an (N−1)th shift register stage 312, an Nth shift register stage 313, an (N+1)th shift register stage 314 and an (N+2)th shift register stage 315. For the sake of brevity, only the internal structure of the Nth shift register stage 313 is exemplified in detail. The internal structures of other shift register stages are similar to the Nth shift register stage 313 and can be inferred by analogy. In the operation of the shift register circuit 300, the Nth shift register stage 313 is utilized for generating a gate signal SGn and a driving control voltage VQn according to a gate signal SGn−2 generated by the (N−2)th shift register stage 311, a driving control voltage VQn−2 generated by the (N−2)th shift register stage 311, a driving control voltage VQn−1 generated by the (N−1)th shift register stage 312, a gate signal SGn+2 generated by the (N+2)th shift register stage 315, the first system clock HC1, the third system clock HC3, the first pull-down clock LC1, and the second pull-down clock LC2. The circuit functions of other shift register stages are similar to the Nth shift register stage 313 and can be inferred by analogy.

The Nth shift register stage 313 is similar to the Nth shift register stage 113 shown in FIG. 1, differing in that the driving adjustment unit 135 is replaced with a driving adjustment unit 335. The driving adjustment unit 335, electrically connected to the driving unit 130, the input unit 120 and the (N−1)th shift register stage 312, is put in use for adjusting the driving control voltage VQn according to the driving control voltage VQn−1 and the first system clock HC1. In the embodiment shown in FIG. 4, the driving adjustment unit 335 comprises a first transistor 336 and a first capacitor 337. The first transistor 336 comprises a first end for receiving the first system clock HC1, a gate end electrically connected to the (N−1)th shift register stage 312 for receiving the driving control voltage VQn−1, and a second end for outputting an adjustment control voltage CPn. The first capacitor 337 comprises a first end electrically connected to the second end of the first transistor 336, and a second end electrically connected to the input unit 120 and the driving unit 130. Likewise, regarding the shift register circuit 300 having the driving adjustment unit 335, it is noted that the gate end of the first transistor 336 is not limited to receive the driving control voltage VQn−1. As long as the driving adjustment unit 335 is capable of adjusting the driving control voltage VQn from a high-level voltage to a voltage higher than the high-level voltage, the gate end of the first transistor 336 may be employed to receive a signal other than the driving control voltage VQn−1. The gate-signal scanning operation of the shift register circuit 300 is similar to the aforementioned gate-signal scanning operation of the shift register circuit 100 and can be inferred by analogy.

Figure 5:
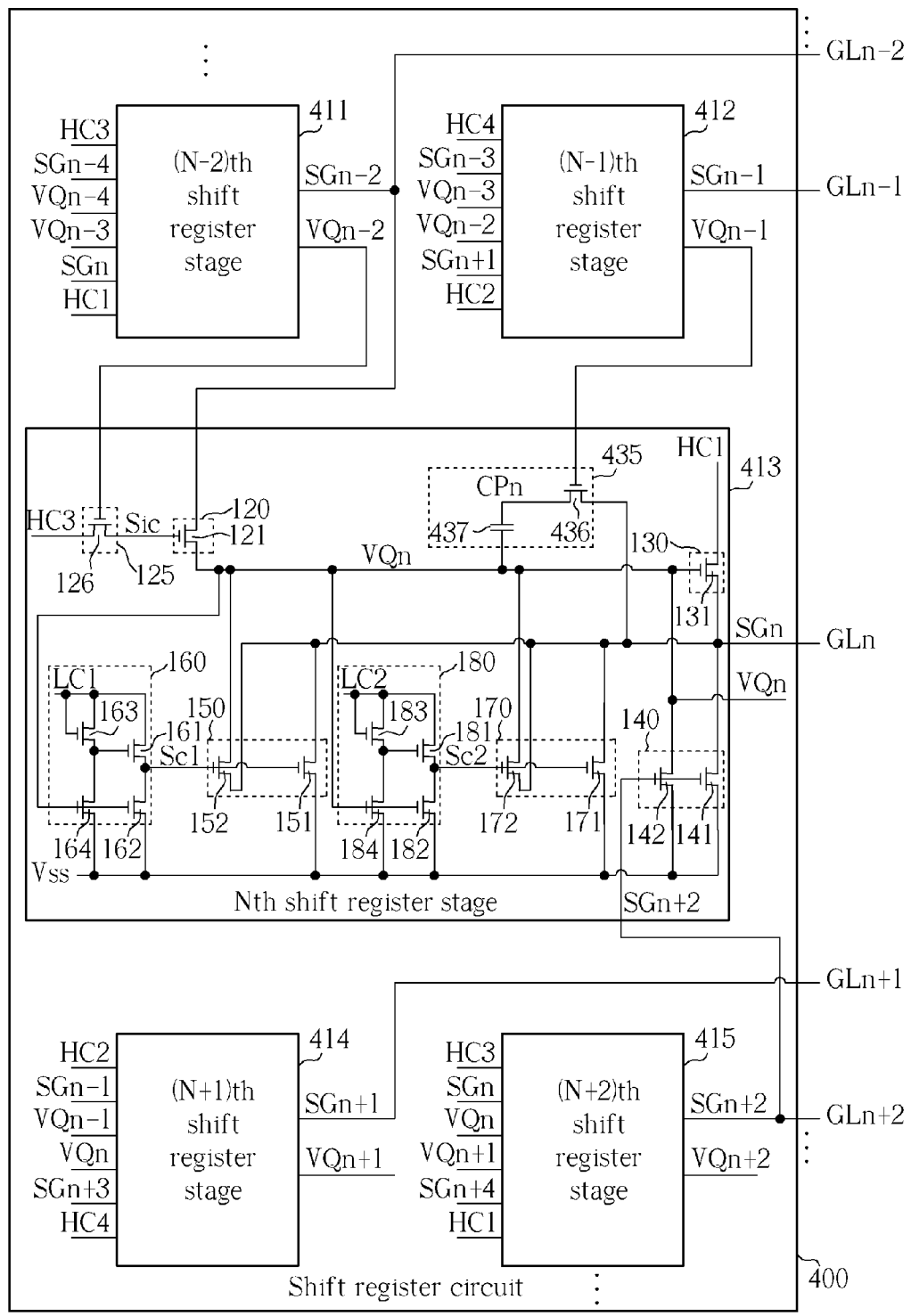
FIG. 5 is a schematic diagram showing a shift register circuit in accordance with a fourth embodiment of the present invention.

FIG. 5 is a schematic diagram showing a shift register circuit in accordance with a fourth embodiment of the present invention. As shown in FIG. 5, the shift register circuit 400 comprises a plurality of shift register stages and, for ease of explanation, illustrates an (N−2)th shift register stage 411, an (N−1)th shift register stage 412, an Nth shift register stage 413, an (N+1)th shift register stage 414 and an (N+2)th shift register stage 415. For the sake of brevity, only the internal structure of the Nth shift register stage 413 is exemplified in detail. The internal structures of other shift register stages are similar to the Nth shift register stage 413 and can be inferred by analogy. The Nth shift register stage 413 is similar to the Nth shift register stage 313 shown in FIG. 4, differing in that the driving adjustment unit 335 is replaced with a driving adjustment unit 435. The driving adjustment unit 435, electrically connected to the driving unit 130, the input unit 120, the (N−1)th shift register stage 412 and the gate line GLn, is put in use for adjusting the driving control voltage VQn according to the driving control voltage VQn−1 and the gate signal SGn.

In the embodiment shown in FIG. 5, the driving adjustment unit 435 comprises a first transistor 436 and a first capacitor 437. The first transistor 436 comprises a first end electrically connected to the gate line GLn for receiving the gate signal SGn, a gate end electrically connected to the (N−1)th shift register stage 412 for receiving the driving control voltage VQn−1, and a second end for outputting an adjustment control voltage CPn. The first capacitor 437 comprises a first end electrically connected to the second end of the first transistor 436, and a second end electrically connected to the input unit 120 and the driving unit 130. Likewise, regarding the shift register circuit 400 having the driving adjustment unit 435, it is noted that the gate end of the first transistor 436 is not limited to receive the driving control voltage VQn−1. As long as the driving adjustment unit 435 is capable of adjusting the driving control voltage VQn from a high-level voltage to a voltage higher than the high-level voltage, the gate end of the first transistor 436 may be employed to receive a signal other than the driving control voltage VQn−1. The gate-signal scanning operation of the shift register circuit 400 is similar to the aforementioned gate-signal scanning operation of the shift register circuit 100 and can be inferred by analogy.

Figure 6:
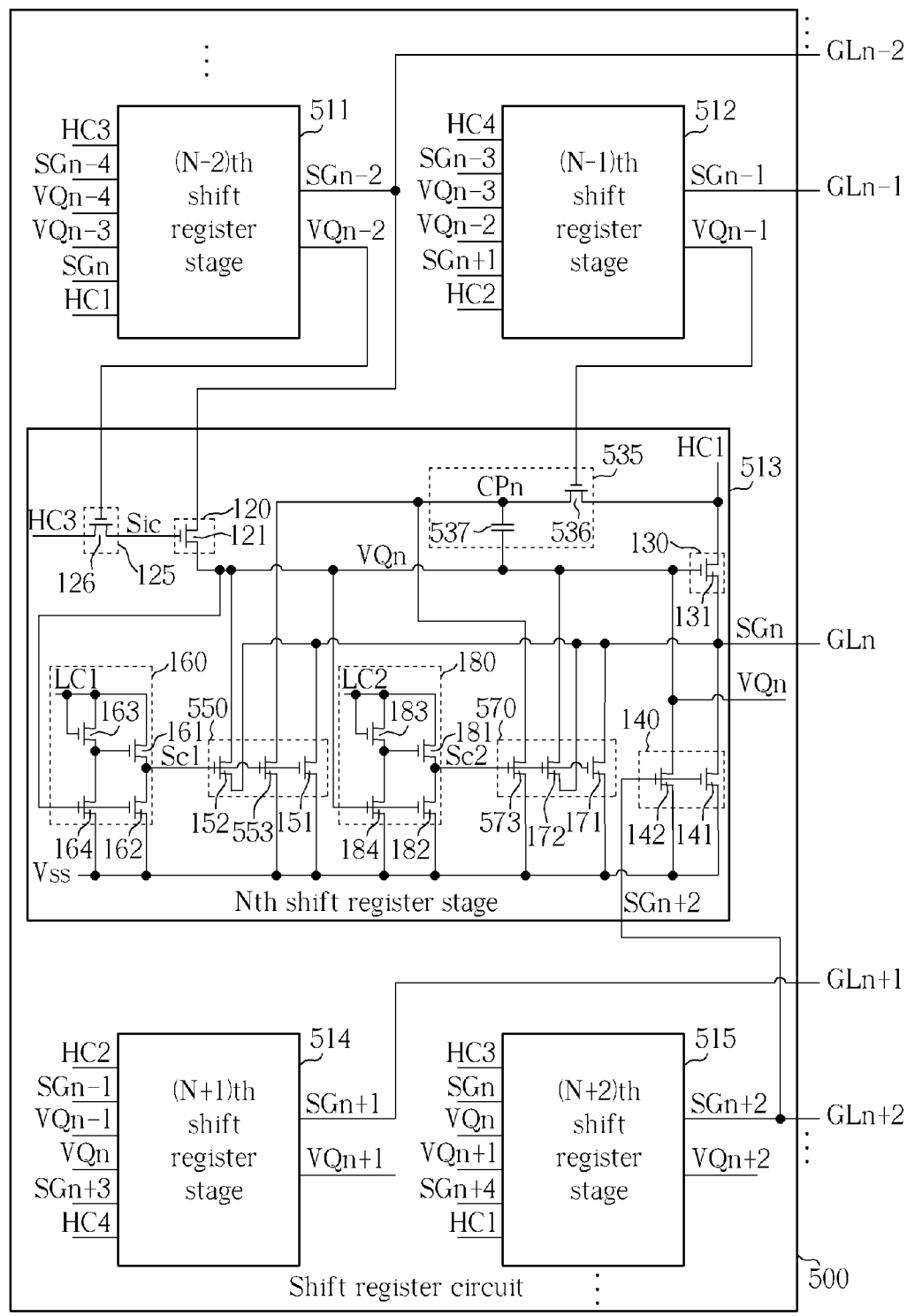
FIG. 6 is a schematic diagram showing a shift register circuit in accordance with a fifth embodiment of the present invention.

FIG. 6 is a schematic diagram showing a shift register circuit in accordance with a fifth embodiment of the present invention. As shown in FIG. 6, the shift register circuit 500 comprises a plurality of shift register stages and, for ease of explanation, illustrates an (N−2)th shift register stage 511, an (N−1)th shift register stage 512, an Nth shift register stage 513, an (N+1)th shift register stage 514 and an (N+2)th shift register stage 515. For the sake of brevity, only the internal structure of the Nth shift register stage 513 is exemplified in detail. The internal structures of other shift register stages are similar to the Nth shift register stage 513 and can be inferred by analogy. The Nth shift register stage 513 is similar to the Nth shift register stage 313 shown in FIG. 4, differing in that the driving adjustment unit 335 is replaced with a driving adjustment unit 535, the second pull-down unit 150 is replaced with a second pull-down unit 550, and the third pull-down unit 170 is replaced with a third pull-down unit 570.

The driving adjustment unit 535, electrically connected to the driving unit 130, the input unit 120 and the (N−1)th shift register stage 512, is put in use for adjusting the driving control voltage VQn according to the driving control voltage VQn−1 and the first system clock HC1. In the embodiment shown in FIG. 6, the driving adjustment unit 535 comprises a first transistor 536 and a first capacitor 537. The first transistor 536 comprises a first end for receiving the first system clock HC1, a gate end electrically connected to the (N−1)th shift register stage 512 for receiving the driving control voltage VQn−1, and a second end for outputting an adjustment control voltage CPn. The first capacitor 537 comprises a first end electrically connected to the second end of the first transistor 536, and a second end electrically connected to the input unit 120 and the driving unit 130. Likewise, regarding the shift register circuit 500 having the driving adjustment unit 535, it is noted that the gate end of the first transistor 536 is not limited to receive the driving control voltage VQn−1. As long as the driving adjustment unit 535 is capable of adjusting the driving control voltage VQn from a high-level voltage to a voltage higher than the high-level voltage, the gate end of the first transistor 536 may be employed to receive a signal other than the driving control voltage VQn−1.

Compared with the second pull-down unit 150 shown in FIG. 4, the second pull-down unit 550 further comprises an eighth transistor 553 which is utilized for pulling down the adjustment control voltage CPn to the power voltage Vss according to the first control signal Sc1. The eighth transistor 553 comprises a first end electrically connected to the second end of the first transistor 536, a gate end for receiving the first control signal Sc1, and a second end for receiving the power voltage Vss. Compared with the third pull-down unit 170 shown in FIG. 4, the third pull-down unit 570 further comprises a fifteenth transistor 573 which is utilized for pulling down the adjustment control voltage CPn to the power voltage Vss according to the second control signal Sc2. The fifteenth transistor 573 comprises a first end electrically connected to the second end of the first transistor 536, a gate end for receiving the second control signal Sc2, and a second end for receiving the power voltage Vss. The gate-signal scanning operation of the shift register circuit 500 is similar to the aforementioned gate-signal scanning operation of the shift register circuit 100 and can be inferred by analogy.

Figure 7:
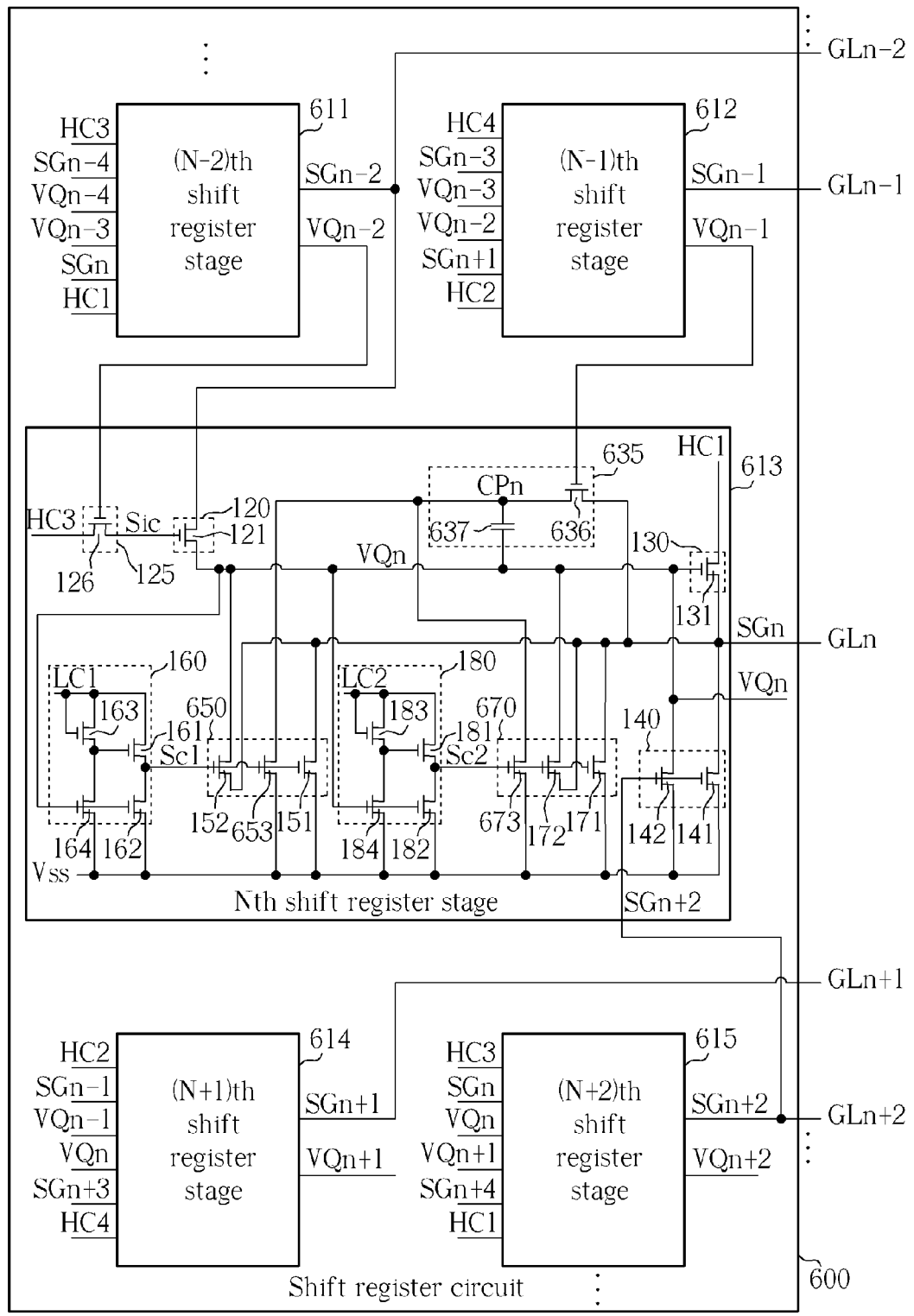
FIG. 7 is a schematic diagram showing a shift register circuit in accordance with a sixth embodiment of the present invention.

FIG. 7 is a schematic diagram showing a shift register circuit in accordance with a sixth embodiment of the present invention. As shown in FIG. 7, the shift register circuit 600 comprises a plurality of shift register stages and, for ease of explanation, illustrates an (N−2)th shift register stage 611, an (N−1)th shift register stage 612, an Nth shift register stage 613, an (N+1)th shift register stage 614 and an (N+2)th shift register stage 615. For the sake of brevity, only the internal structure of the Nth shift register stage 613 is exemplified in detail. The internal structures of other shift register stages are similar to the Nth shift register stage 613 and can be inferred by analogy. The Nth shift register stage 613 is similar to the Nth shift register stage 413 shown in FIG. 5, differing in that the driving adjustment unit 435 is replaced with a driving adjustment unit 635, the second pull-down unit 150 is replaced with a second pull-down unit 650, and the third pull-down unit 170 is replaced with a third pull-down unit 670.

The driving adjustment unit 635, electrically connected to the driving unit 130, the input unit 120, the (N−1)th shift register stage 612 and the gate line GLn, is put in use for adjusting the driving control voltage VQn according to the driving control voltage VQn−1 and the gate signal SGn. In the embodiment shown in FIG. 7, the driving adjustment unit 635 comprises a first transistor 636 and a first capacitor 637. The first transistor 636 comprises a first end electrically connected to the gate line GLn for receiving the gate signal SGn, a gate end electrically connected to the (N−1)th shift register stage 612 for receiving the driving control voltage VQn−1, and a second end for outputting an adjustment control voltage CPn. The first capacitor 637 comprises a first end electrically connected to the second end of the first transistor 636, and a second end electrically connected to the input unit 120 and the driving unit 130. Likewise, regarding the shift register circuit 600 having the driving adjustment unit 635, it is noted that the gate end of the first transistor 636 is not limited to receive the driving control voltage VQn−1. As long as the driving adjustment unit 635 is capable of adjusting the driving control voltage VQn from a high-level voltage to a voltage higher than the high-level voltage, the gate end of the first transistor 636 may be employed to receive a signal other than the driving control voltage VQn−1.

Compared with the second pull-down unit 150 shown in FIG. 5, the second pull-down unit 650 further comprises an eighth transistor 653 which is utilized for pulling down the adjustment control voltage CPn to the power voltage Vss according to the first control signal Sc1. The eighth transistor 653 comprises a first end electrically connected to the second end of the first transistor 636, a gate end for receiving the first control signal Sc1, and a second end for receiving the power voltage Vss. Compared with the third pull-down unit 170 shown in FIG. 5, the third pull-down unit 670 further comprises a fifteenth transistor 673 which is utilized for pulling down the adjustment control voltage CPn to the power voltage Vss according to the second control signal Sc2. The fifteenth transistor 673 comprises a first end electrically connected to the second end of the first transistor 636, a gate end for receiving the second control signal Sc2, and a second end for receiving the power voltage Vss. The gate-signal scanning operation of the shift register circuit 600 is similar to the aforementioned gate-signal scanning operation of the shift register circuit 100 and can be inferred by analogy.

To sum up, in the operation of the shift register circuit according to the present invention, the pull-down time of gate signals can be significantly shortened for increasing effective pixel charging time so as to achieve high pixel charging rate, which may be employed to enhance display quality or to downsize driving transistors for saving power consumption and shrinking panel border area to bring the cost down.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:

a driving unit, electrically connected to an Nth gate line of
the gate lines, for outputting an Nth gate signal of the
gate signals according to a first system clock and an Nth
driving control voltage, wherein the Nth gate line is
employed to transmit the Nth gate signal;
an input unit, electrically connected to the driving unit, for
outputting the Nth driving control voltage according to
an input control signal and a first input signal;
a driving adjustment unit, electrically connected to the
driving unit and the input unit, for adjusting the Nth
driving control voltage according to a second input signal and a third input signal, the driving adjustment unit
comprising:
a first transistor having a first end for receiving the second input signal, a second end for outputting an
adjustment control voltage, and a gate end for receiving the third input signal;
a first capacitor having a first end electrically connected
to the second end of the first transistor, and a second
end electrically connected to the input unit and the
driving unit; and
a second capacitor having a first end directly connected
to the second end of the first transistor, and a second
end for receiving a fifth input signal; and
a first pull-down unit, directly connected to the input unit
and the Nth gate line, for pulling down the Nth gate
signal and the Nth driving control voltage according to a
fourth input signal.

2. The shift register circuit of claim 1, wherein the second
input signal is the first system clock or the Nth gate signal, and
the third input signal is an (N−1)th driving control voltage
generated by an (N−1)th shift register stage of the shift register stages.

3. The shift register circuit of claim 1, wherein the fifth
input signal is the Nth gate signal or an (N+1)th gate signal
generated by an (N+1)th shift register stage of the shift register stages.

4. The shift register circuit of claim 1, further comprising:
a second pull-down unit, electrically connected to the input
unit and the Nth gate line, for pulling down the Nth gate
signal and the Nth driving control voltage according to a
first control signal; and
a first control unit, electrically connected to the input unit
and the second pull-down unit, for providing the first
control signal according to the Nth driving control voltage and a first pull-down clock.

5. The shift register circuit of claim 4, wherein:
the second pull-down unit comprises:
a second transistor having a first end electrically connected to the Nth gate line, a gate end for receiving the
first control signal, and a second end for receiving a
power voltage; and
a third transistor having a first end electrically connected
to the input unit and the driving unit, a gate end for
receiving the first control signal, and a second end
electrically connected to the Nth gate line; and
the first control unit comprises:
a fourth transistor having a first end for receiving the first
pull-down clock, a second end for outputting the first
control signal, and a gate end;
a fifth transistor having a first end electrically connected
to the second end of the fourth transistor, a gate end
electrically connected to the input unit and the driving
unit, and a second end for receiving the power voltage;
a sixth transistor having a first end for receiving the first
pull-down clock, a gate end for receiving the first
pull-down clock, and a second end electrically connected to the gate end of the fourth transistor; and
a seventh transistor having a first end electrically connected to the second end of the sixth transistor, a gate
end electrically connected to the gate end of the fifth
transistor, and a second end for receiving the power
voltage.

6. The shift register circuit of claim 5, wherein the second
pull-down unit further comprises:
an eighth transistor having a first end electrically connected to the second end of the first transistor, a gate end
for receiving the first control signal, and a second end for
receiving the power voltage;
wherein the eighth transistor is employed to pull down the
adjustment control voltage according to the first control
signal.

7. The shift register circuit of claim 4, further comprising:
a third pull-down unit, electrically connected to the input
unit and the Nth gate line, for pulling down the Nth gate
signal and the Nth driving control voltage according to a
second control signal; and
a second control unit, electrically connected to the input
unit and the third pull-down unit, for providing the second control signal according to the Nth driving control
voltage and a second pull-down clock having a phase
opposite to the first pull-down clock.

8. The shift register circuit of claim 7, wherein:
the third pull-down unit comprises:
a second transistor having a first end electrically connected to the Nth gate line, a gate end for receiving the
second control signal, and a second end for receiving
a power voltage; and
a third transistor having a first end electrically connected
to the input unit and the driving unit, a gate end for
receiving the second control signal, and a second end
electrically connected to the Nth gate line; and
the second control unit comprises:
a fourth transistor having a first end for receiving the
second pull-down clock, a second end for outputting
the second control signal, and a gate end;
a fifth transistor having a first end electrically connected
to the second end of the fourth transistor, a gate end
electrically connected to the input unit and the driving
unit, and a second end for receiving the power voltage;
a sixth transistor having a first end for receiving the
second pull-down clock, a gate end for receiving the
second pull-down clock, and a second end electrically
connected to the gate end of the fourth transistor; and
a seventh transistor having a first end electrically connected to the second end of the sixth transistor, a gate
end electrically connected to the gate end of the fifth
transistor, and a second end for receiving the power
voltage.

9. The shift register circuit of claim 8, wherein the third
pull-down unit further comprises:
an eighth transistor having a first end electrically connected to the second end of the first transistor, a gate end
for receiving the second control signal, and a second end
for receiving the power voltage;
wherein the eighth transistor is employed to pull down the
adjustment control voltage according to the second control signal.

10. The shift register circuit of claim 1, further comprising:
an input control unit, electrically connected to the input
unit, for providing the input control signal according to a sixth input signal and a third system clock having a phase opposite to the first system clock.

11. The shift register circuit of claim 10, wherein the input control unit comprises:

a second transistor having a first end for receiving the third system clock, a gate end for receiving the sixth input signal, and a second end for outputting the input control signal.

12. The shift register circuit of claim 11, wherein the sixth input signal is an (N−2)th driving control voltage generated by an (N−2)th shift register stage of the shift register stages.

13. The shift register circuit of claim 1, wherein the driving unit comprises:

a second transistor having a first end for receiving the first system clock, a gate end for receiving the Nth driving control voltage, and a second end electrically connected to the Nth gate line.

14. The shift register circuit of claim 1, wherein the input unit comprises:

a second transistor having a first end for receiving the first input signal, a gate end for receiving the input control signal, and a second end for outputting the Nth driving control voltage.

15. The shift register circuit of claim 14, wherein the first input signal is an (N−2)th gate signal generated by an (N−2)th shift register stage of the shift register stages.

16. The shift register circuit of claim 1, wherein the first pull-down unit comprises:

a second transistor having a first end electrically connected to the Nth gate line, a gate end for receiving the fourth input signal, and a second end for receiving a power voltage; and a third transistor having a first end electrically connected to the input unit and the driving unit, a gate end for receiving the fourth input signal, and a second end for receiving the power voltage.

17. The shift register circuit of claim 16, wherein the fourth input signal is an (N+2)th gate signal generated by an (N+2)th shift register stage of the shift register stages.

* * * * *